(12) United States Patent
Kim et al.

(10) Patent No.: US 10,707,276 B2
(45) Date of Patent: Jul. 7, 2020

(54) DISPLAY DEVICE

(71) Applicant: Samsung Display Co., Ltd., Yongin-Si, Gyeonggi-Do (KR)

(72) Inventors: Won Tae Kim, Suwon-si (KR); Tae Jin Kong, Suwon-si (KR); Hee-Keun Lee, Suwon-si (KR); Seung-Jin Chu, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/204,723

(22) Filed: Nov. 29, 2018

(65) Prior Publication Data

US 2019/0378881 A1 Dec. 12, 2019

(30) Foreign Application Priority Data

Jun. 7, 2018 (KR) .................. 10-2018-0065630

(51) Int. Cl.
*H01L 27/32* (2006.01)
*G02F 1/13357* (2006.01)
*G02F 1/1335* (2006.01)

(52) U.S. Cl.
CPC ...... *H01L 27/322* (2013.01); *G02F 1/133617* (2013.01); *G02F 1/133528* (2013.01); *G02F 2001/133548* (2013.01); *G02F 2202/28* (2013.01)

(58) Field of Classification Search
CPC ............ H01L 27/322; G02F 1/133617; G02F 2202/28; G02F 1/133528; G02F 2001/133548
See application file for complete search history.

(56) References Cited

U.S. PATENT DOCUMENTS

| 9,651,724 B2 | 5/2017 | Cross et al. |
| 2018/0107069 A1* | 4/2018 | Lee .................. G02F 1/13338 |
| 2019/0293992 A1* | 9/2019 | Ibaraki ............. G02F 1/136204 |

FOREIGN PATENT DOCUMENTS

| KR | 10-2015-0116022 A | 10/2015 |
| KR | 10-1658143 B1 | 9/2016 |
| KR | 10-2017-0106607 A | 9/2017 |
| KR | 10-2017-0136680 A | 12/2017 |

* cited by examiner

*Primary Examiner* — Dung A. Le
(74) *Attorney, Agent, or Firm* — Innovation Counsel LLP

(57) ABSTRACT

An exemplary embodiment of the present inventive concept provides a display device including: a thin film transistor panel comprising a display area and a peripheral area; and a color conversion panel overlapping the thin film transistor panel, wherein the color conversion panel includes: a substrate; a color conversion layer; a first organic layer disposed between the color conversion layer and the thin film transistor panel; a second organic layer disposed between the first organic layer and the thin film transistor panel; and a polarization layer disposed between the second organic layer and the thin film transistor panel, wherein the first organic layer overlaps the display area and the peripheral area, and the second organic layer overlaps the display area.

12 Claims, 17 Drawing Sheets

DISPLAY DEVICE

CROSS-REFERENCE TO RELATED APPLICATION

This application claims priority to and the benefit of Korean Patent Application No. 10-2018-0065630 filed in the Korean Intellectual Property Office on Jun. 7, 2018, the entire contents of which are incorporated herein by reference.

BACKGROUND

(a) Field

The present disclosure relates to a display device and a manufacturing method thereof.

(b) Description of the Related Art

A liquid crystal display may include two field generating electrodes, a liquid crystal layer, a color filter, and a polarization layer. Because light generated from a light source reaches a user through the liquid crystal layer, the color filter, and the polarization layer, light loss may be generated in the polarization layer, the color filter, and the like. The light loss may also be generated in a display device such as an organic light emitting diode display and the like as well as the liquid crystal display.

To realize a display device having high color reproducibility while decreasing light loss, a display device including a color conversion display panel using a semiconductor nanocrystal has been proposed.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments have been made in an effort to provide a display device that is capable of suppressing a lifting phenomenon of an organic layer or an inorganic layer in a peripheral area, and improving reliability thereof. Exemplary embodiments have been made in an effort to provide a display device that is capable of color reproducibility thereof.

An exemplary embodiment of the present inventive concept provides a display device including: a thin film transistor panel configured to have a display area and a peripheral area; and a color conversion panel configured to overlap the thin film transistor panel, wherein the color conversion panel includes: a substrate; a color conversion layer disposed between the substrate and the thin film transistor panel to contain semiconductor nanocrystals; a first organic layer disposed between the color conversion layer and the thin film transistor panel; a second organic layer disposed between the first organic layer and the thin film transistor panel; and a polarization layer disposed between the second organic layer and the thin film transistor panel, wherein the first organic layer overlaps the display area and the peripheral area, and the second organic layer overlaps the display area. An edge of the second organic layer may be disposed between the display area and an edge of the thin film transistor panel adjacent to the edge of the second organic layer. The second organic layer may not overlap the peripheral area in a plan view.

The display device may further include: a first inorganic layer disposed between the first organic layer and the second organic layer; and a second inorganic layer disposed between the second organic layer and the polarization layer.

The first inorganic layer may overlap the display area and the peripheral area, and the second inorganic layer may overlap the display area. An edge of the second inorganic layer may be disposed between the display area and an edge of the thin film transistor panel adjacent to the edge of the second organic layer.

The second inorganic layer may be separated from the peripheral area in a plan view.

The second organic layer may partially overlap the peripheral area in a plan view.

The second inorganic layer may overlap the peripheral area.

The display device may further include a dummy color filter layer configured to overlap the peripheral area.

The dummy color filter layer may overlap the first organic layer and the first inorganic layer.

The dummy color filter layer may not overlap the second organic layer and the second inorganic layer in a plan view.

Edges of the polarization layer and the second organic layer may coincide with each other.

Edges of the second organic layer and the second inorganic layer may coincide with each other.

An exemplary embodiment of the present inventive concept provides a manufacturing method of a display device, including: preparing a substrate having a display area and a peripheral area; forming a color conversion layer containing semiconductor nanocrystals on the substrate; forming a first organic layer on the color conversion layer; forming a second organic material layer and a metal forming layer on the first organic layer; and sequentially removing the metal forming layer and the second organic material layer in the peripheral area to form a metal layer and a second organic layer.

The manufacturing method may further include: forming a first inorganic layer between the first organic layer and the second organic material layer; and forming a second inorganic material layer between the second organic material layer and the forming metal layer.

The manufacturing method may further include forming a second inorganic layer by removing the second inorganic material layer in the peripheral area.

Edges of the metal layer and the second organic layer may substantially coincide with each other.

The metal layer may be removed by using a first photosensitive resin pattern as a mask.

The second inorganic material layer and the second organic material layer may be removed by using the first photosensitive resin pattern as a mask.

The first photosensitive resin pattern may be removed, and the second inorganic material layer and the second organic material layer may be removed by using the metal layer as a mask.

The manufacturing method may further include: removing the first photosensitive resin pattern and forming a second photosensitive resin pattern covering the metal layer, the second photosensitive resin pattern partially overlaps the peripheral area; and etching the second inorganic material layer and the second organic material layer by using the second photosensitive resin pattern as a mask.

According to the exemplary embodiments, it is possible to provide a display device with improved reliability by suppressing a lifting phenomenon of an organic layer or an inorganic layer in a peripheral area.

DETAILED DESCRIPTION OF THE EMBODIMENTS

Figure 1:
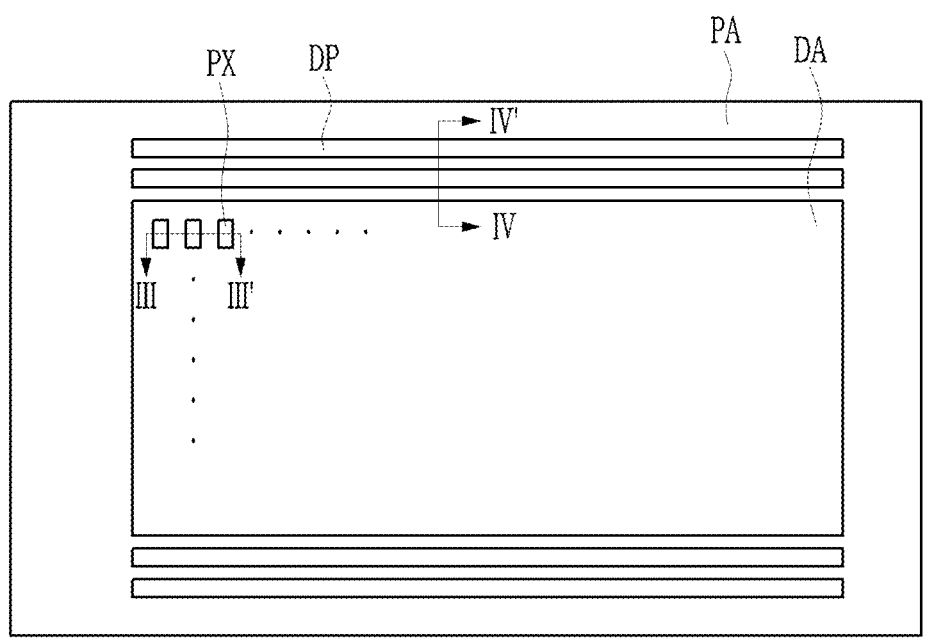
FIG. 1 is a schematic top plan view illustrating a display device according to an exemplary embodiment.
Figure 1:
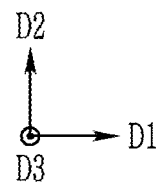

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Figure 2:
FIG. 2 is a schematic cross-sectional view illustrating a display device according to an exemplary embodiment.
Figure 3:
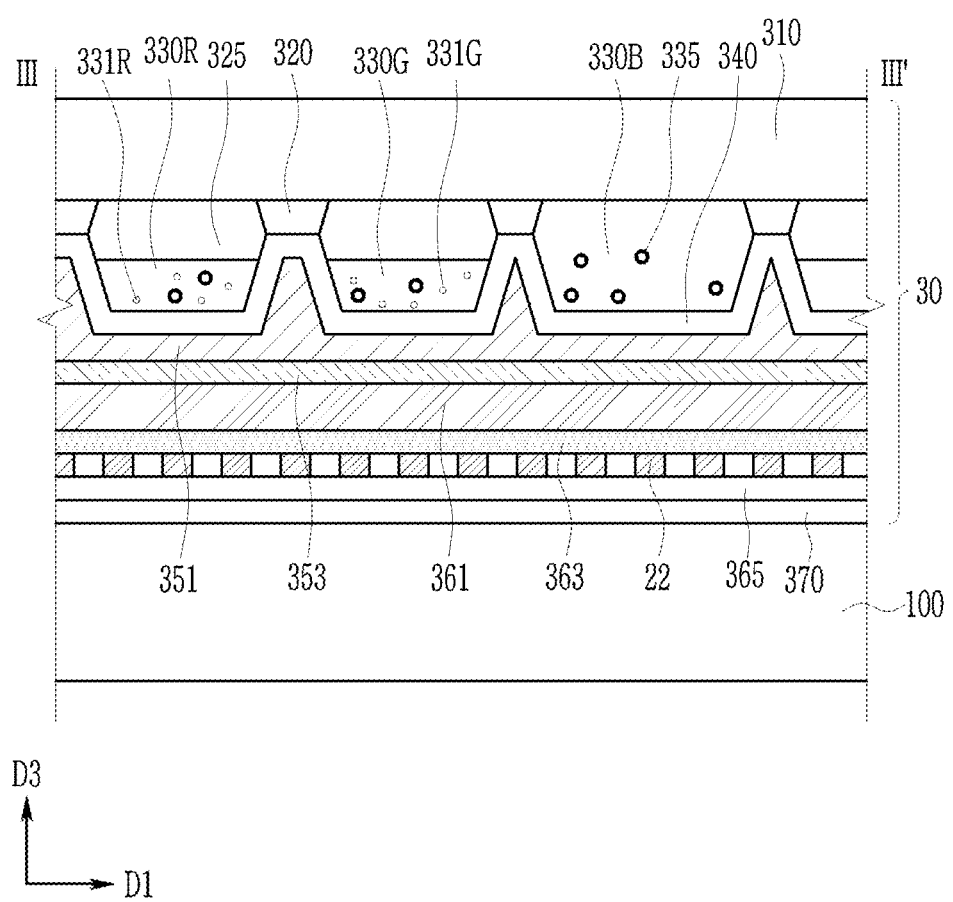
FIG. 3 is a cross-sectional view taken along a line III-III' of FIG. 1.
Figure 4:
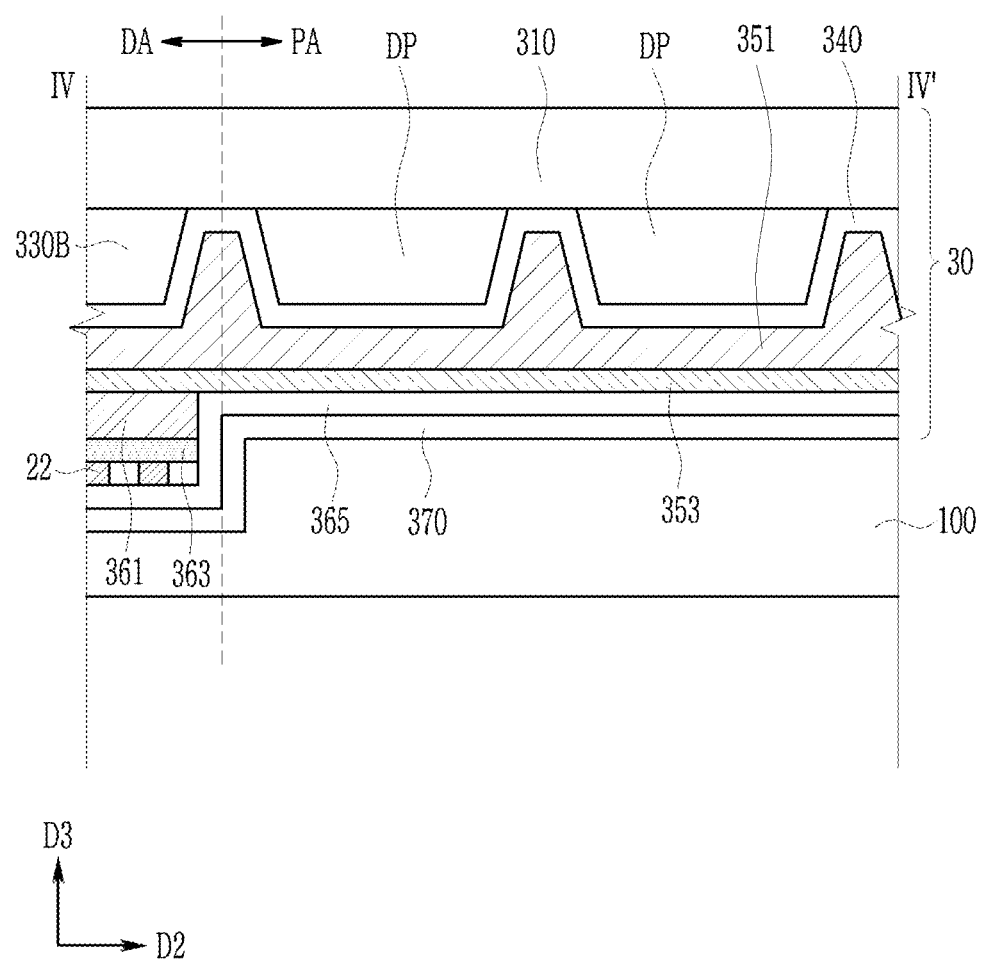
FIG. 4 is a cross-sectional view taken along a line IV-IV' of FIG. 1.

Hereinafter, a display device according to an exemplary embodiment will be described with reference to FIG. 1 to FIG. 4. FIG. 1 is a schematic top plan view illustrating a display device according to an exemplary embodiment, FIG. 2 is a schematic cross-sectional view illustrating a display device according to an exemplary embodiment, FIG. 3 is a cross-sectional view taken along a line III-III' of FIG. 1, and FIG. 4 is a cross-sectional view taken along a line IV-IV' of FIG. 1.

The display device according to the present exemplary embodiment may include a display area for displaying an image and a peripheral area PA disposed at an edge of the display area DA.

A plurality of pixels PX may be disposed along a first direction D1 and a second direction D2 in the display area DA Each of the pixels PX may include a thin film transistor and a pixel electrode connected thereto.

A dummy pattern DP may be disposed in the peripheral area PA. Although the present specification shows a form in which the dummy pattern DP extends along the first direction D1, it is not limited thereto. Hereinafter, the dummy pattern DP will be described in detail with reference to FIG. 4.

The display device according to an exemplary embodiment may include a thin film transistor panel 100 and a color conversion panel 30 overlapped therewith.

The thin film transistor panel 100 may have any form including a thin film transistor and an electrode connected therewith. In addition, the thin film transistor panel 100 may include a thin film transistor, a pixel electrode, and a liquid crystal layer, or may include a thin film transistor, a pixel electrode, and an emission layer. It is not limited to such exemplary embodiments.

Hereinafter, a color conversion panel 30 overlapping the display area DA will be described with reference to FIG. 3, and a color conversion panel 30 overlapping the peripheral area PA will be described with reference to FIG. 4.

Referring to FIG. 3, the color conversion panel 30 includes a substrate 310 that is overlapped with the thin film transistor panel 100.

A light blocking layer 320 is disposed between the substrate 310 and the thin film transistor panel 100. The light blocking layer 320 may be disposed between a red color conversion layer 330R and a green color conversion layer 330G, between a green color conversion layer 330G and a transmissive layer 330B, and between a transmissive layer 330B and a red color conversion layer 330R along the first direction D1. In addition, the light blocking layer 320 may be disposed between a red color conversion layer 330R and a red color conversion layer 330R which are adjacent to each other, between a green color conversion layer 330G and a green color conversion layer 330G which are adjacent to each other, and between a transmissive layer 330B and a transmissive layer 330B which are adjacent to each other. The light blocking layer 320 may have a lattice shape or a linear shape in a plan view.

The light blocking layer 320 may prevent mixture of different light emitted from adjacent pixels, and may partition regions in which the red color conversion layer 330R, the green color conversion layer 330G, and the transmissive layer 330B are disposed. The light blocking layer 320 may be made of any material that is capable of blocking (reflecting or absorbing) light.

A blue light cutting filter 325 may be disposed on the substrate 310 between adjacent light blocking layers 320, and between the substrate 310 and the thin film transistor panel 100. The blue light cutting filter 325 may be positioned between the red color conversion layer 330R and the substrate 310 and between the green color conversion layer 330G and the substrate 310. The blue light cutting filter 325 may overlap regions emitting red and green light, and may not overlap a region emitting blue light.

The blue light cutting filter 325 includes a first region overlapping the red color conversion layer 330R and a second region overlapping the green color conversion layer 330G. The first region and the second region may be separated from each other. However, the present inventive concept is not limited thereto, and the first region and the second region may be connected to each other in a plan view. When the first region and the second region are separated from each other, the separate blue light cutting filter 325 may include a same material or different materials.

The blue light cutting filter 325 may block blue light passing through the red color conversion layer 330R and the green color conversion layer 330G. The blue light introduced into the red color conversion layer 330R and the green color conversion layer 330G is converted into red or green light by semiconductor nanocrystals 331R or 331G. In this case, some of the blue light may be outputted without any conversion. The blue light emitted without conversion is mixed with the red light or the green light, thus color reproducibility may deteriorate. However, the blue light cutting filter 325 may block (absorb or reflect) the blue light supplied from a light source from being emitted through the substrate 310 without absorption in the red color conversion layer 330R and the green color conversion layer 330G.

The blue light cutting filter 325 may include any material that is capable of obtaining the above-described effects, and as one example, it may include a yellow color filter. The blue light cutting filter 325 may have a stacked structure of a single layer or multiple layers.

In the present specification, the blue light cutting filter 325 contacting the substrate 310 is shown, but the present inventive concept is not limited thereto, and a separate buffer layer may be positioned between the substrate 310 and the blue light cutting filter 325.

A plurality of the color conversion layers 330R and 330G and the transmissive layer 330B may be positioned between the substrate 310 and the thin film transistor panel 100. The color conversion layers 330R and 330G and the transmissive layer 330B may be arranged along the first direction.

The color conversion layers 330R and 330G may convert incident light into light having a different wavelength from that of the incident light, and emit the converted light. The color conversion layer 330R and 330G may include red color conversion layers 330R and green color conversion layers 330G.

The incident light is not converted in the transmissive layer 330B, and the incident light may be emitted as it is. As an example, blue light may be incident on the transmissive layer 330B, and may be emitted as it is.

The red color conversion layer 330R may include a first semiconductor nanocrystal 331R that converts incident blue light into red light. The first semiconductor nanocrystal 331R may include at least one of a phosphor and a quantum dot.

The green color conversion layer 330G may include the second semiconductor nanocrystals 331G that convert incident blue light into green light. The second semiconductor nanocrystal 331G may include at least one of a phosphor and a quantum dot.

The quantum dots included in the first semiconductor nanocrystal 331R and the second semiconductor nanocrystal 331G may be independently selected from a Group II-VI compound, a Group III-V compound, a Group IV-VI compound, a Group IV element, a Group IV compound, and a combination thereof.

For the group II-VI compound, a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, may be employed. For the group III-V compound, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; or a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof, may be employed. For the group IV-VI compound, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof, may be employed. For the IV group element, Si, Ge, or a mixture thereof may be selected. For the IV group compound, a binary compound selected from SiC, SiGe, and a mixture thereof may be employed.

In this case, the binary compound, the ternary compound, or the quaternary compound may exist in a uniform concentration or in a partially different concentration in particles. The quantum dot may include multiple quantum dots, and the quantum dots may have a core/shell structure in which one quantum dot surrounds another quantum dot. An interface between a core and a shell may have a concentration gradient such that a concentration of an element in the shell decreases toward a center thereof.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, light emitted through the quantum dot may be emitted in all directions to have a Lambertian emission pattern, thereby improving a viewing angle of light.

When the first semiconductor nanocrystal 331R includes a red phosphor, the red phosphor may include at least one selected from a group including (Ca, Sr, Ba)S, (Ca, Sr, Ba)$_2$Si$_5$N$_8$, CaAlSiN$_3$, CaMoO$_4$, and Eu$_2$Si$_5$N$_8$, but the present disclosure is not limited thereto.

When the second semiconductor nanocrystal 331G includes a green phosphor, the green phosphor may include at least one selected from a group including yttrium aluminum garnet (YAG), $(Ca, Sr, Ba)_2SiO_4$, $SrGa_2S_4$, BAM, α-SiAlON, β-SiAlON, $Ca_3Sc_2Si_3O_{12}$, $Tb_3A_{15}O_{12}$, $BaSiO_4$, CaAlSiON and $(Sr_{1-x}Ba_x)Si_2O_2N_2$, but the present disclosure is not limited thereto. The x may be any number between 0 and 1.

The transmissive layer 330B may pass incident light as it is. The transmissive layer 330B may include a resin passing blue light. The transmissive layer 330B positioned at the region emitting the blue light does not include semiconductor nanocrystals, and passes the incident blue as it is.

Although not shown, the transmissive layer 330B may further include at least one of a dye and a pigment. The transmissive layer 330B including the dye or pigment may reduce the external light reflection, and may provide the blue light with improved color purity.

At least one of the red color conversion layer 330R, the green color conversion layer 330G, and the transmissive layer 330B may further include scatterers 335. Contents of respective scatterers 335 included in the red color conversion layer 330R, the green color conversion layer 330G, and the transmissive layer 330B may be different or the same.

The scatterers 335 may increase an amount of light that is converted in or passes through the color conversion layers 330R and 330G and the transmissive layer 330B and then is emitted, and may uniformly provide front luminance and lateral luminance.

The scatterers 335 may include any material that is capable of evenly scattering incident light. As an example, the scatterer 335 may include at least one among $TiO_2$, $ZrO_2$, $Al_2O_3$, $In_2O_3$, ZnO, $SnO_2$, $Sb_2O_3$, and ITO.

The red color conversion layer 330R, the green color conversion layer 330G, and the transmissive layer 330B may include a photosensitive resin as an example, and may be manufactured by a photolithography process. Alternatively, the red color conversion layer 330R, the green color conversion layer 330G, and the transmissive layer 330B may be manufactured by a printing process or an inkjet process, and when manufactured by the printing or inkjet process, they may include materials other than the photosensitive resin. In the present specification, it is illustrated that the color conversion layer and the transmission layer are formed by the photolithography process or the printing process, but the present disclosure is not limited thereto.

An optical filter layer 340 is disposed between the color conversion layers 330R and 330G and a first organic layer 351, and between the transmissive layer 330B and the first organic layer 351.

The optical filter layer 340 may serve as a filter that reflects or absorbs light other than light having a specific wavelength while transmitting the light having the specific wavelength. The light filter layer 340 may have a structure in which layers having a high refractive index and layers having a low refractive index are alternately stacked, and may utilize reinforcement and/or offsetting interference between these layers to transmit and/or reflect the predetermined wavelength as above-described.

The light filter layer 340 may include at least one of $TiO_2$, $SiN_x$, $SiO_y$, TiN, AlN, $Al_2O_3$, $SnO_2$, $WO_3$, and $ZrO_2$, and as one example, it may have a structure in which $SiN_x$ and $SiO_y$ are alternately stacked. The x and y may be adjusted according to process conditions for forming the layers as factors for determining a chemical composition ratio in $SiN_x$ and $SiO_y$.

In another exemplary embodiment, the light filter layer 340 may be omitted, and it may be replaced with a low refractive layer or the like.

The first organic layer 351 is disposed between the optical filter layer 340 and the thin film transistor panel 100. The first organic layer 351 may overlap a front surface of the substrate 310, and may overlap the display area DA and the peripheral area PA.

The first organic layer 351 may planarize one surface of the red color conversion layer 330R, the green color conversion layer 330G, and the transmissive layer 330B. The first organic layer 351 may include an organic material, but is not limited thereto, and may include any material that is capable of the planarizing function.

A first inorganic layer 353 may be disposed between the first organic layer 351 and the thin film transistor panel 100. The first inorganic layer 353 may include any inorganic material, e.g., a silicon oxide or a silicon nitride.

The first inorganic layer 353 may protect the first organic layer 351, or may help the stacking of the first organic layer 351 and a second organic layer 361.

The second organic layer 361 may be disposed between the first inorganic layer 353 and the thin film transistor panel 100. The second organic layer 361 may include a material that is the same as or similar to that of the first organic layer 351.

One of surfaces of the color conversion layers 330R and 330G and the transmissive layer 330B may be planarized through the first organic layer 351. However, when steps between the color conversion layers 330R and 330G and the transmissive layer 330B are large, it may not be easy to planarize one surface of the color conversion layers 330R and 330G and the transmissive layer 330B by only using the first organic layer 351. According to the present exemplary embodiment, the color conversion panel 30 may more delicately planarize one surface of the color conversion layers 330R and 330G and the transmissive layer 330B through the second organic layer 361.

A second inorganic layer 363 may be disposed between the second organic layer 361 and the thin film transistor panel 100. The second inorganic layer 363 may include a material that is the same as or similar to that of the first inorganic layer 353.

The second inorganic layer 363 may help the stacking of a polarization layer 22. A stable stacked structure may be provided by forming the polarization layer 22 on the second inorganic layer 363.

The polarization layer 22 may be disposed between the second inorganic layer 363 and the thin film transistor panel 100.

As the polarization layer 22, at least one of an applied polarization layer, a coated polarization layer, and a wire grid polarizer may be used. For example, the polarization layer 22 may be a wire grid polarizer including a metal pattern. When the polarization layer 22 is the wire grid polarizer, it may include a plurality of bars of the second polarization layer 22 having a width of several nanometers. The polarization layer 22 may be formed by using various methods such as a coating method, an attaching method, and a printing method.

An insulating layer 365 and a common electrode 370 may be disposed between the polarization layer 22 and the thin film transistor panel 100.

The insulating layer 365 serves to insulate the common electrode 370 and the polarization layer 22 made of a metal from each other. When the polarization layer 22 is not made of a metal, the insulating layer may be omitted. The common electrode 370 to which a common voltage is applied may generate an electric field together with the pixel electrode included in the thin film transistor panel 100.

Hereinafter, the color conversion panel 30 disposed in the peripheral area PA will be described with reference to FIG. 4. Description of components similar to those of the above-described components will be omitted.

A dummy pattern DP, specifically, a dummy color filter layer DP, may be disposed between the substrate 310 and the thin film transistor panel 100. The dummy color filter layer DP may have a same shape as the dummy pattern as illustrated in FIG. 1.

The dummy color filter layer DP may be disposed on a same layer as the red color conversion layer 330R, the green color conversion layer 330G, and the transmissive layer 330B described with reference to FIG. 3. In addition, the dummy color filter layer DP may include a same material as that of at least one of the red color conversion layer 330R, the green color conversion layer 330G, or the transmissive layer 330B. For example, the dummy color filter layer DP may include a same material as that of the transmissive layer 330B. The dummy color filter layer DP may be manufactured together in the process of manufacturing the red color conversion layer 330R, the green color conversion layer 330G, or the transmission layer 330B.

A step between a stacked structure disposed in the display area DA and a stacked structure disposed in the peripheral area PA may not be large because of the action of the dummy color filter layer DP.

The optical filter layer 340, the first organic layer 351, and the first inorganic layer 353 may be sequentially disposed between the thin film transistor panel 100 and the dummy color filter layer DP disposed in the peripheral area PA at the same time with the optical filter layer 340, the first organic layer 351 and the first inorganic layer 353 disposed in the display area DA.

The optical filter layer 340, the first organic layer 351, and the first inorganic layer 353 are the same as aforementioned. The first organic layer 351 and the first inorganic layer 353 may entirely overlap the display area DA and the peripheral area PA. According to the present exemplary embodiment, the second organic layer 361 and the second inorganic layer 363 may overlap the display area DA, and may not overlap the peripheral area PA. The second organic layer 361 and the second inorganic layer 363 may have a shape in which they are removes from the peripheral area PA in a plan view.

The polarization layer 22 may also be disposed in the display area DA only. The polarization layer 22 may overlap the color conversion layers 330R and 330G and the transmissive layer 330B, and may not overlap the dummy color filter layer DP.

At least two edges of the polarization layer 22, the second inorganic layer 363, and the second organic layer 361 disposed in the display area DA may overlap each other. Edges of the polarization layer 22 and the second organic layer 361 may coincide with each other, and edges of the second organic layer 361 and the second inorganic layer 363 may coincide with each other. Edges of the polarization layer 22, the second inorganic layer 363, and the second organic layer 361 may coincide with each other.

The insulating layer 365 and the common electrode 370 are disposed between the polarization layer 22 and the thin film transistor panel 100. The insulating layer 365 and the common electrode 370 may overlap the display area DA and the peripheral area PA. The insulating layer 365 may contact the first inorganic layer 353 in the peripheral area PA.

The first organic layer 351 and the first inorganic layer 353 disposed in the peripheral area PA may overlap the dummy color filter layer DP. The insulating layer 365 and the common electrode 370 disposed in the peripheral area PA may overlap the dummy color filter layer DP. The second organic layer 361 and the second inorganic layer 363 may be removed from the peripheral area PA. The second organic layer 361 and the second inorganic layer 363 may have a shape in which they do not overlap with the dummy color filter layer DP in a plan view.

According to an exemplary embodiment, it is possible to reduce a lifting phenomenon that occurs in the peripheral area PA by removing the second organic layer 361 and the second inorganic layer 363 disposed in the peripheral area PA.

When the second organic layer 361 and the second inorganic layer 363 are also disposed in the peripheral area PA, a lifting phenomenon may occur between the second organic layer 361 and the second inorganic layer 363 disposed in the peripheral area PA. A portion of the second organic layer 361 may be uncured, and the lifting phenomenon may occur due to out-gassing generated in the uncured second organic layer 361.

However, the display device according to the present exemplary embodiment may have a shape in which the second organic layer 361 and the second inorganic layer 363 disposed in the peripheral area PA are removed. The lifting phenomenon caused by the non-curing of the second organic layer 361 may be reduced, thereby improving the reliability of the display device.

Figure 5:
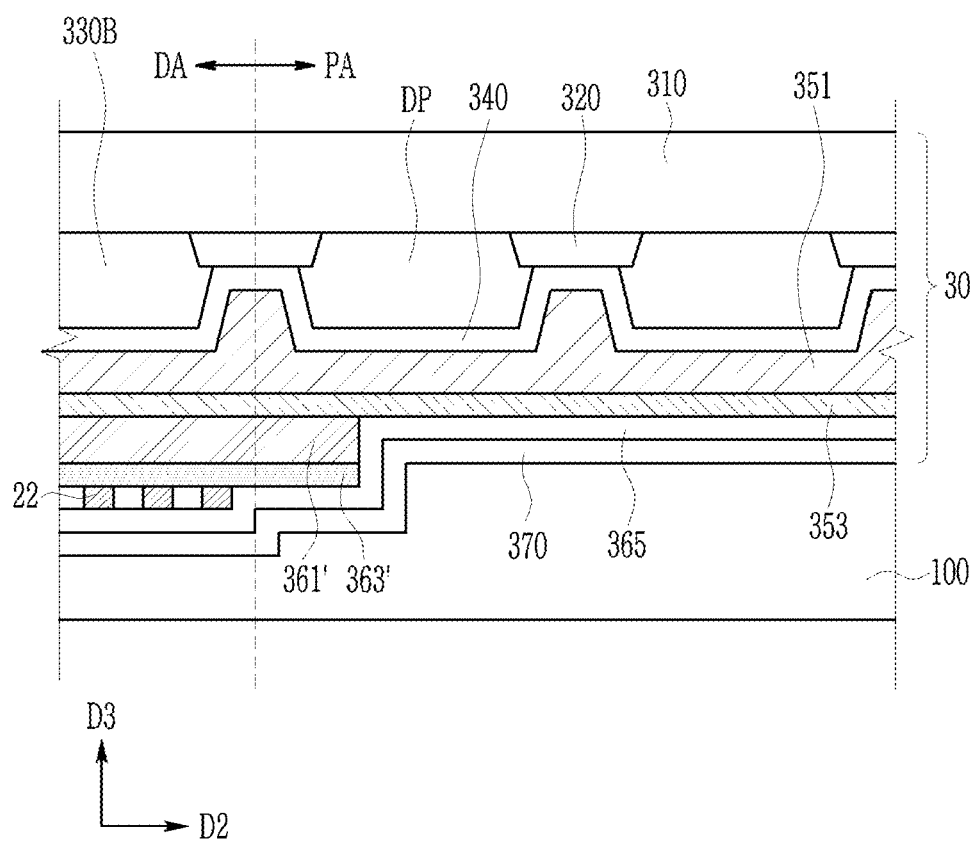
FIG. 5 is a cross-sectional view taken along a line IV-IV' of FIG. 1.

Hereinafter, a display device according to a modified embodiment will described with reference to FIG. 5. FIG. 5 is a cross-sectional view taken along a line IV-IV' of FIG. 1. Description of components similar to those of the above-described components will be omitted.

According to the present exemplary embodiment, a light blocking layer 320 may be disposed between the substrate 310 and the dummy color filter layer DP. The light blocking layer 320 disposed in the peripheral area PA may be omitted as illustrated in FIG. 4.

According to the present exemplary embodiment, the first organic layer 351 and the first inorganic layer 353 may overlap the display area DA and the peripheral area PA. The first organic layer 351 and the first inorganic layer 353 may overlap a front surface of the substrate 110.

A second organic layer 361' and a second inorganic layer 363' may entirely overlap the display area DA, and may partially overlap the peripheral area PA. The second organic layer 361' and the second inorganic layer 363' partially overlapping the peripheral area PA may also partially overlap the dummy color filter layer DP.

According to the present exemplary embodiment, edges of the second organic layer 361' and the second inorganic layer 363' may be coincide with each other in a plan view. In this case, the overlapping edges may be disposed in the peripheral area PA.

The insulating layer 365 may overlap the second inorganic layer 363' and the second organic layer 361' in the peripheral area PA. The insulating layer 365 may contact a top surface and a side surface of the second inorganic layer 363' and a side surface of the second organic layer 361' in the peripheral area PA. The common electrode 370 may also overlap the second inorganic layer 363' and the second organic layer 361' in the peripheral area PA.

Hereinafter, a manufacturing method of a display device according to an exemplary embodiment will be described with reference to FIG. 6 to FIG. 9. FIG. 6, FIG. 7, FIG. 8, and FIG. 9 are cross-sectional views illustrating a manufacturing method of a display device according to an exemplary embodiment. Description of components similar to those of the above-described components will be omitted.

Figure 6:
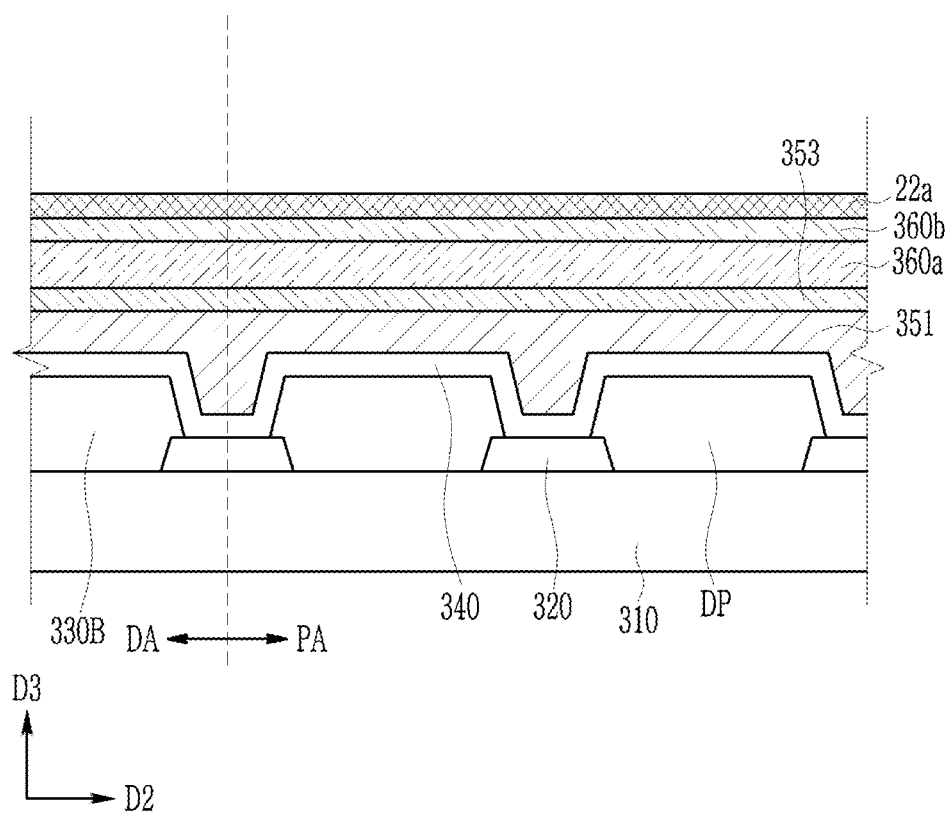
FIG. 6, FIG. 7, FIG. 8, and FIG. 9 are cross-sectional views illustrating a manufacturing method of a display device according to an exemplary embodiment.

Referring to FIG. 6, a light blocking layer 320, a plurality of color conversion layers 330R and 330G, a transmissive layer 330B, and a dummy color filter layer DP are formed on the substrate 310. Next, an optical filter layer 340, a first organic layer 351, a first inorganic layer 353, a second organic material layer 360a, a second inorganic material layer 360b, and a metal layer 22a are formed to overlap a front surface of the substrate 310.

Figure 7:
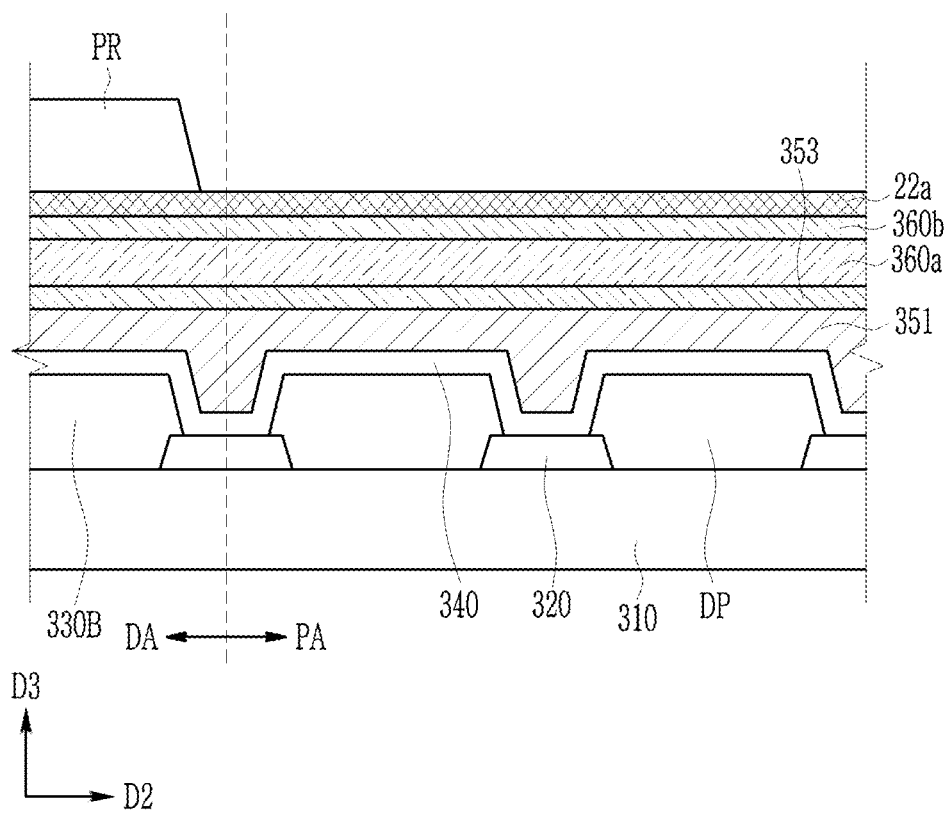

Subsequently, as illustrated in FIG. 7, a first photosensitive resin pattern PR that overlaps the display area DA is formed on the metal layer 22a.

Figure 8:
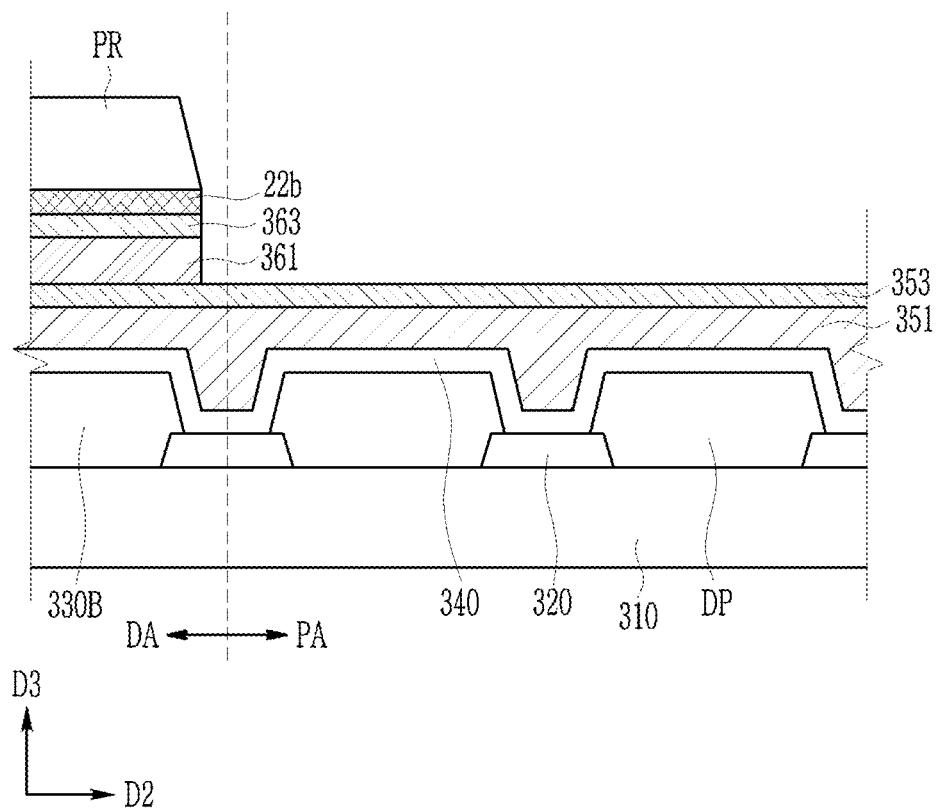

Next, as illustrated in FIG. 8, a second organic layer 361, a second inorganic layer 363, and a metal layer 22b that are etched by using the first photosensitive resin pattern PR as a mask are formed. Edges of the metal layer 22b, the second inorganic layer 363, and the second organic layer 361 that are etched by using the same mask may be aligned and overlapped with each other.

The etched metal layer 22b may be formed through a wet etching process, and the second inorganic layer 363 and the second organic layer 361 may be formed through a dry etching process and an ashing process.

Figure 9:
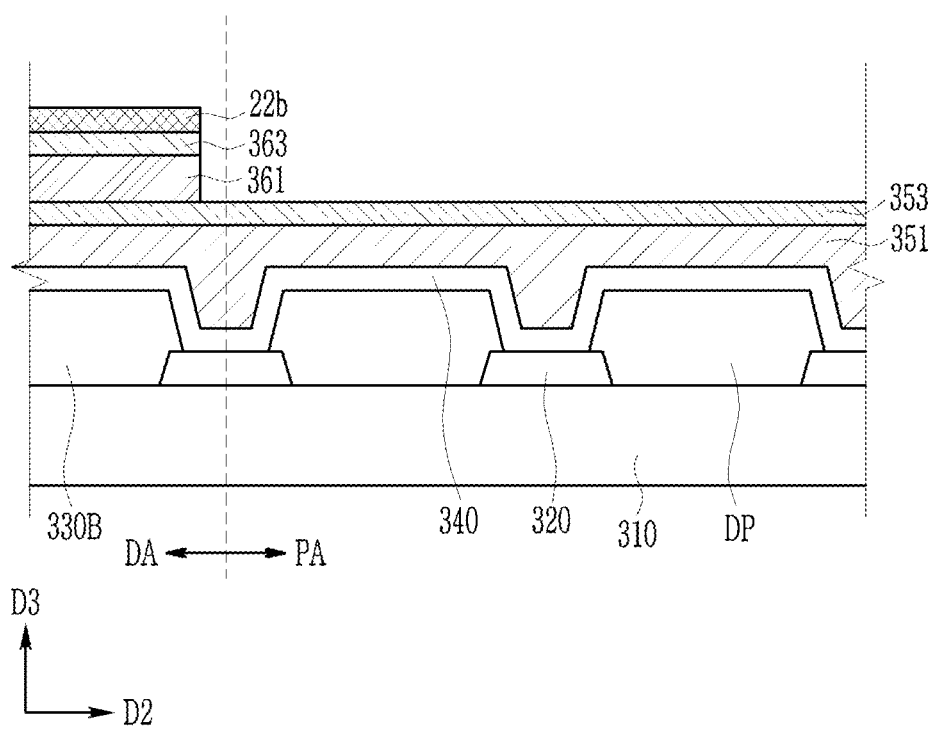

Next, when the first photosensitive resin pattern PR is removed, the metal layer 22b, the second inorganic layer 363, and the second organic layer 361 with edges aligned as illustrated in FIG. 9 may be provided.

An imprint process or the like may then be performed on the metal layer 22b to form the above-described polarizing layer. Thereafter, an insulating layer and a common electrode are sequentially stacked on the polarization layer to provide the color conversion panel as illustrated in FIG. 4.

Figure 10:
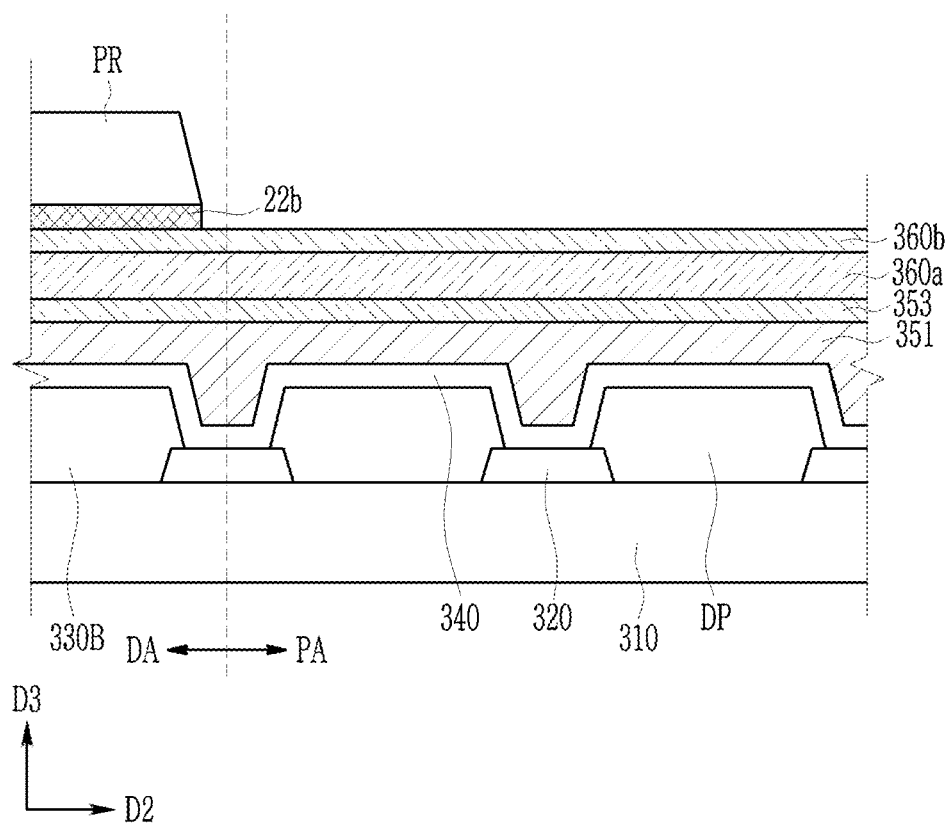
FIG. 10 and FIG. 11 are cross-sectional views illustrating a manufacturing method of a display device according to an exemplary embodiment.
Figure 11:
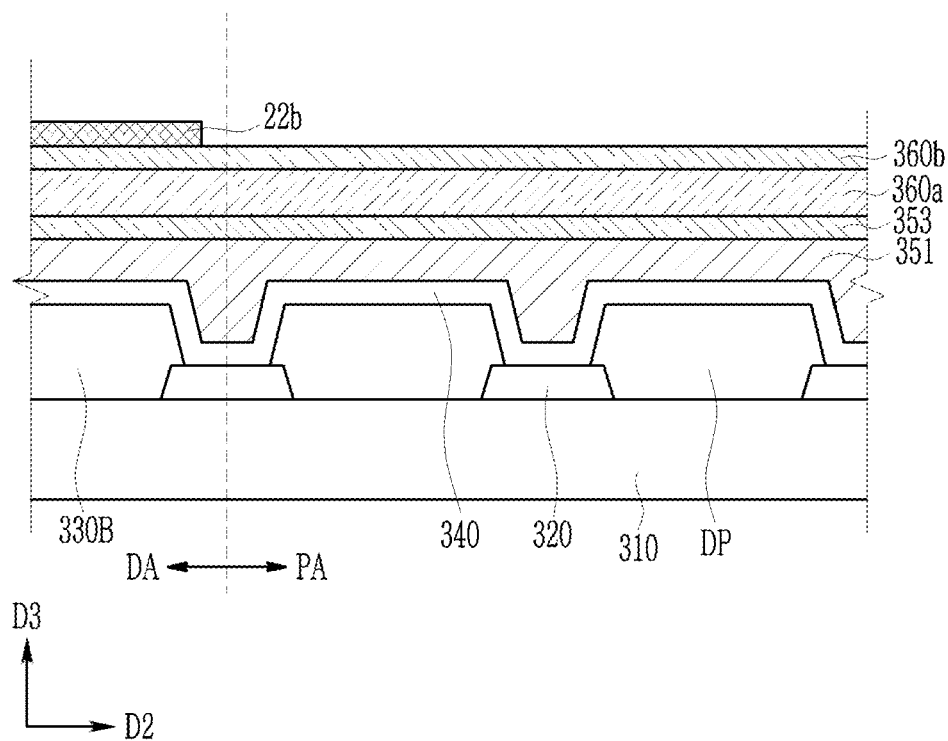

Hereinafter, a manufacturing method of a display device according to another exemplary embodiment will be described with reference to FIG. 10 and FIG. 11. FIG. 10 and FIG. 11 are cross-sectional views illustrating a manufacturing method of a display device according to an exemplary embodiment. Description of components similar to those of the above-described components will be omitted.

Referring to FIG. 10, the metal layer 22b etched by using the first photosensitive resin pattern PR as a mask is formed in a state of being stacked, similar to the manufacturing method described with reference to FIG. 7.

Next, as shown in FIG. 11, the first photosensitive resin pattern PR is removed. Thereafter, a second inorganic material layer 360b and a second organic material layer 360a may be sequentially etched by using the etched metal layer 22b as a mask. The second inorganic material layer 360b and the second organic material layer 360a may be etched through a dry etching process and an ashing process.

In this way, as illustrated in FIG. 9, the metal layer 22b, the second inorganic layer 363, and the second organic layer 361 may be formed. Edges of the metal layer 22b, the second inorganic layer 363, and the second organic layer 361 which are etched may overlap each other.

Next, an imprint process is performed on the etched metal layer 22b to form a polarization layer, and an insulating layer and a common electrode are sequentially stacked in order to provide the color conversion panel as illustrated in FIG. 4.

Figure 12:
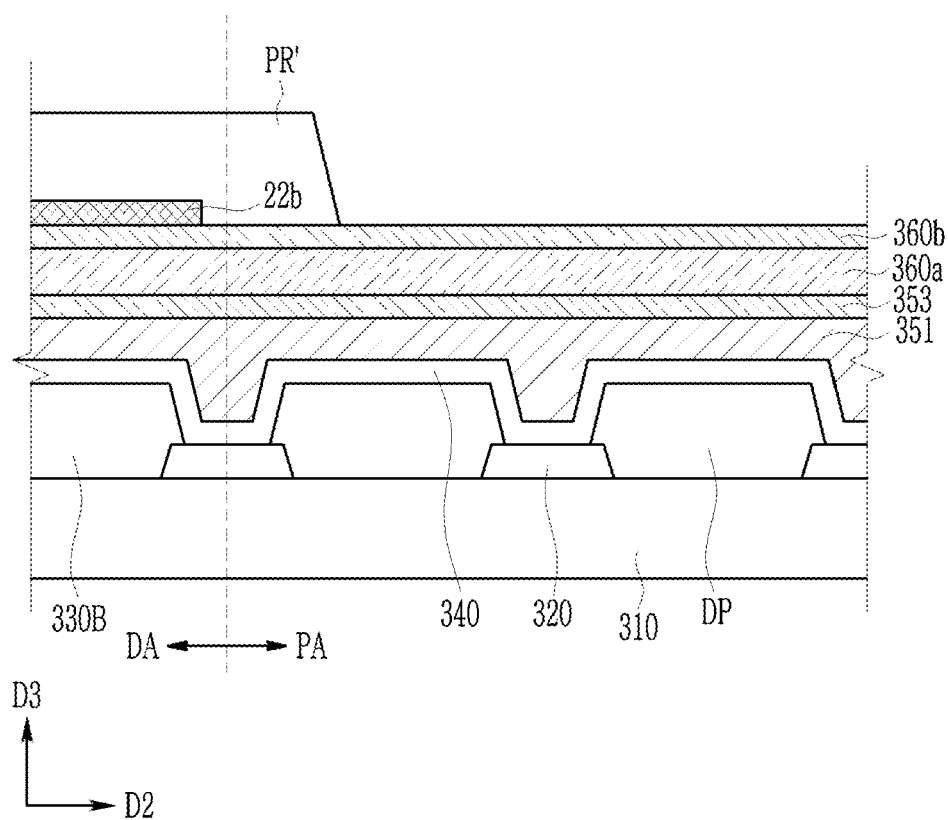
FIG. 12 and FIG. 13 are cross-sectional views illustrating a manufacturing method of a display device according to an exemplary embodiment.
Figure 13:
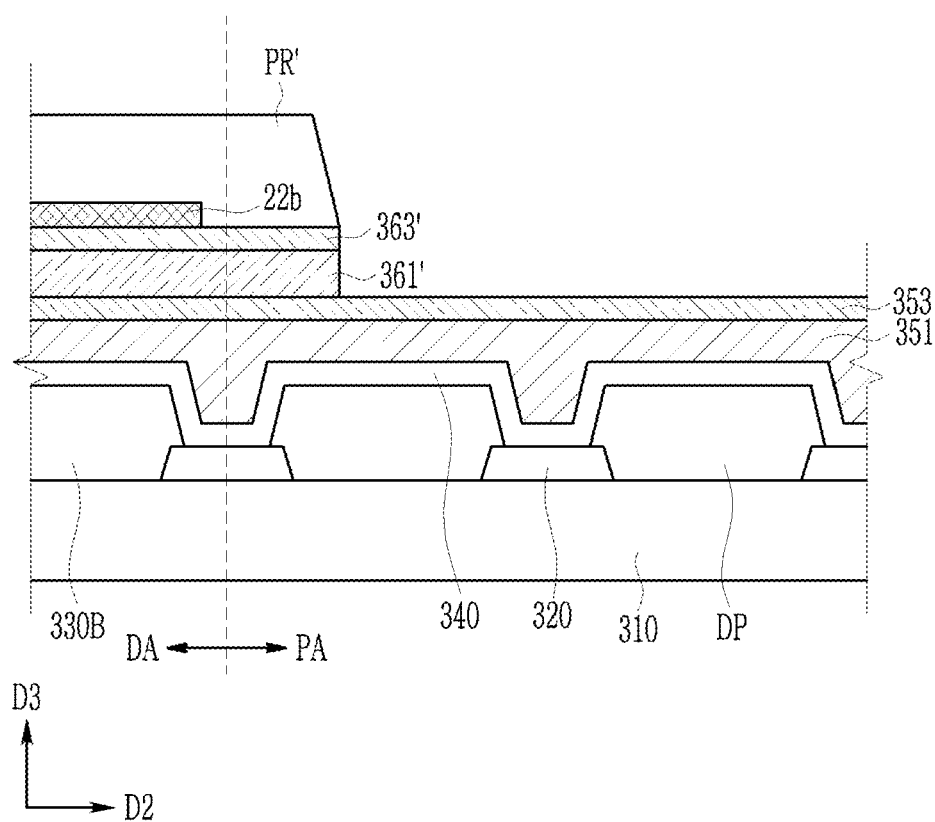

Hereinafter, a manufacturing method of a display device according to another exemplary embodiment will be described with reference to FIG. 12 and FIG. 13. FIG. 12 and FIG. 13 are cross-sectional views illustrating a manufacturing method of a display device according to an exemplary embodiment. Description of components similar to those of the above-described components will be omitted.

Similar to FIG. 10, the metal layer 22b etched by using the first photosensitive resin pattern PR is formed, and then the first photosensitive resin pattern PR is removed.

Next, as illustrated in FIG. 12, a second photosensitive resin pattern PR' is formed on the metal layer 22b which are etched and the second inorganic material layer 360b. The second photosensitive resin pattern PR' may overlap the display area DA, and may partially overlap the peripheral area PA.

Next, as illustrated in FIG. 13, the second photosensitive resin pattern PR' is used as a mask to sequentially form a second inorganic layer 363' and a second organic layer 361'. The second inorganic material layer and the second organic material layer may be etched through a dry etching process and an ashing process.

Next, the second photosensitive resin pattern PR' is removed, an imprint process is performed on the etched metal layer 22b to form a polarization layer, and an insulating layer and a common electrode are sequentially stacked to provide the color conversion panel as illustrated in FIG. 5.

Figure 14:
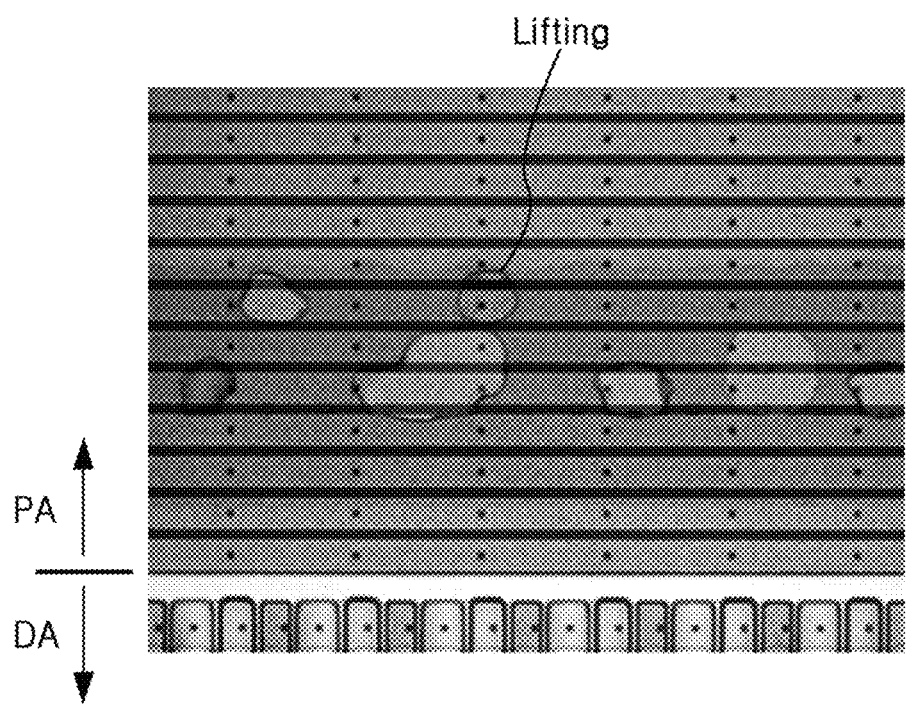
FIG. 14, FIG. 15, and FIG. 16 illustrate images of a peripheral area of a display device according to comparative examples.
Figure 15:
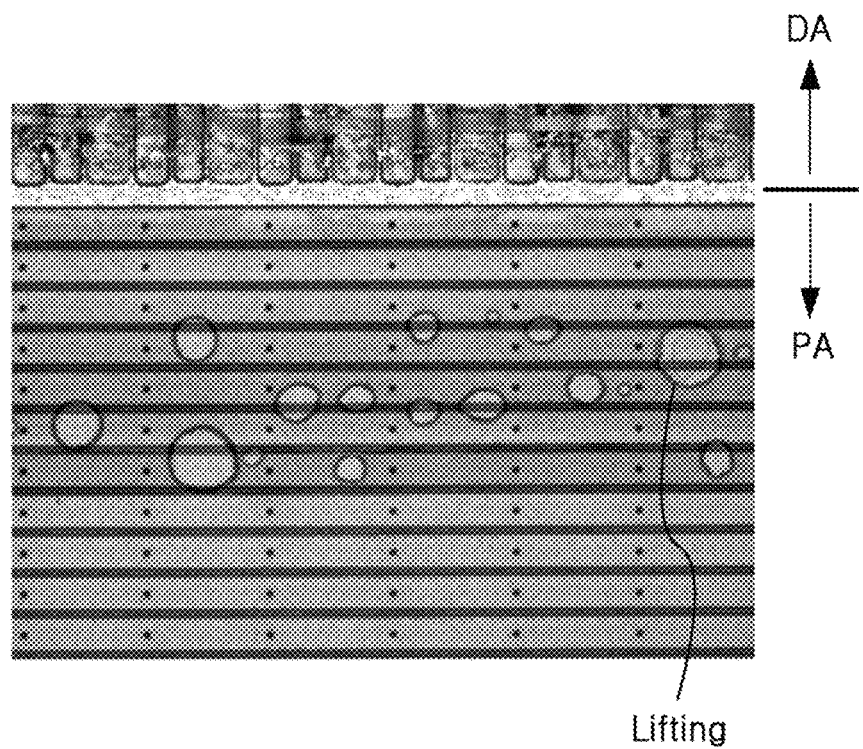
Figure 16:
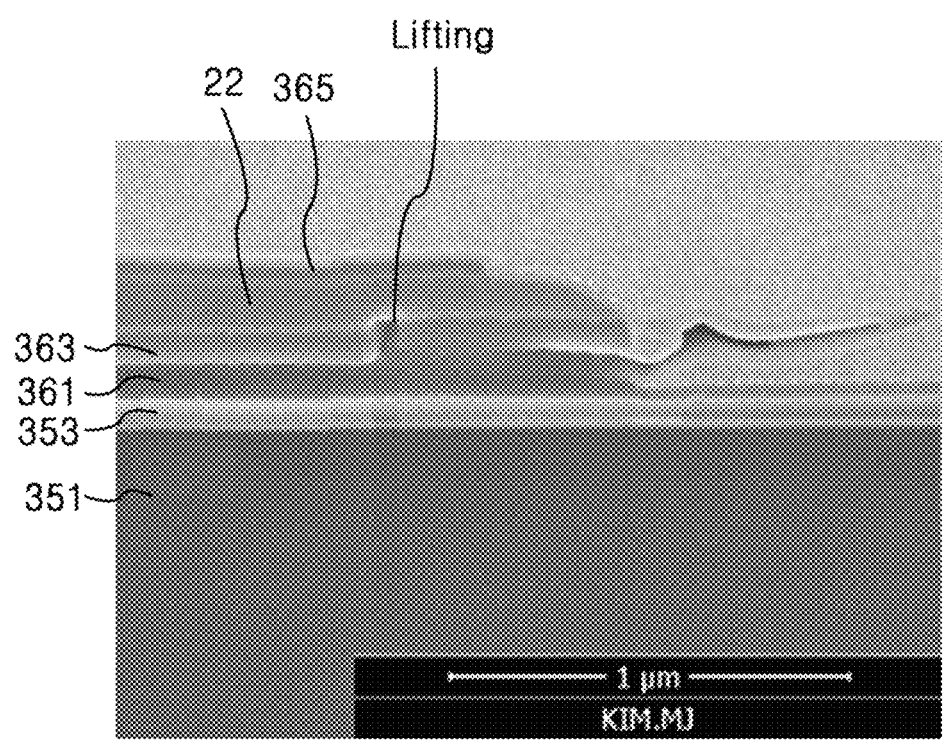

Hereinafter, images of the peripheral area according to examples and comparative examples will be described with reference to FIG. 14 to FIG. 17. FIG. 14, FIG. 15, and FIG. 16 illustrate images of a peripheral area of a display device according to comparative examples, and FIG. 17 illustrates images of a peripheral area according to examples and comparative examples.

Specifically, FIG. 14, FIG. 15, and FIG. 16 illustrate images of a device in which the second organic layer and the second inorganic layer are disposed in the peripheral area PA. It is seen that a lifting phenomenon occurs in the second organic layer disposed in the peripheral area PA.

Figure 17:
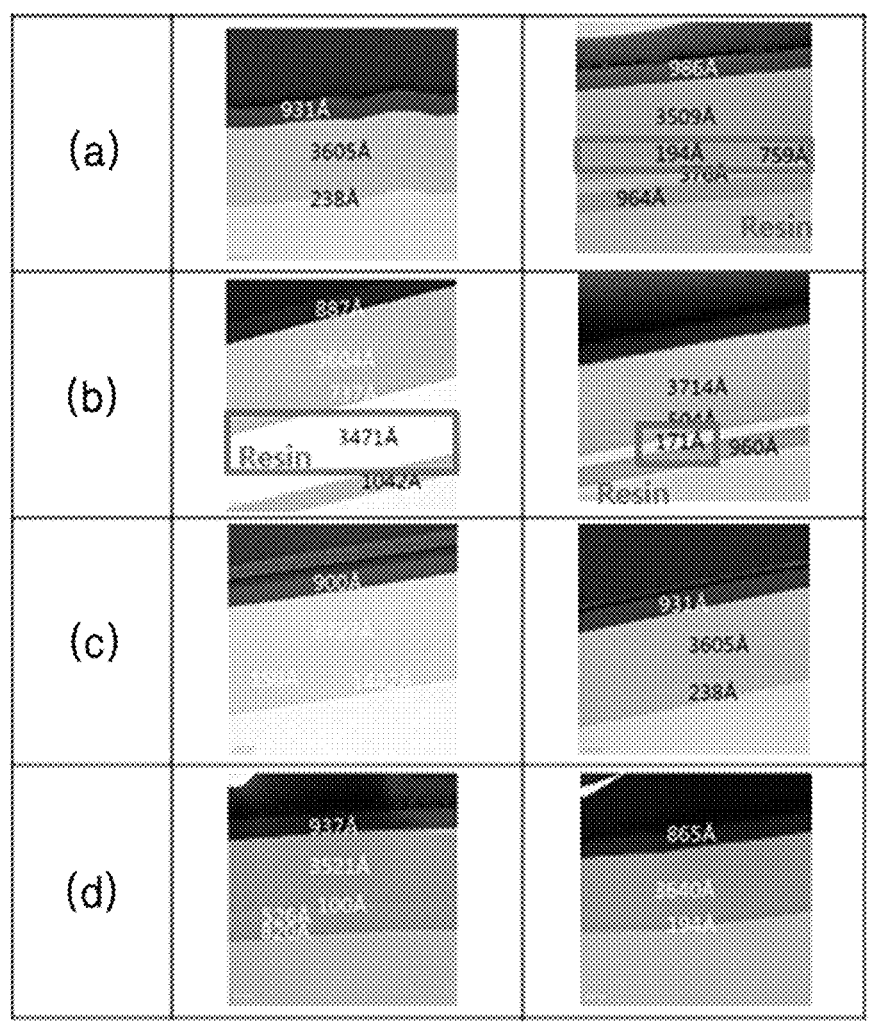
FIG. 17 illustrates images of a peripheral area according to examples and comparative examples.

According to (a) and (b) of FIG. 17, as indicated by the quadrangular box, it is seen that the lifting phenomenon strongly occurs in the peripheral area in comparative examples in which a resin corresponding to the second organic layer is disposed in the peripheral area.

In contrast, according to (c) and (d) of FIG. 17, it is seen that the lifting phenomenon does not occur or hardly occurs in the peripheral area where the second organic layer and the second inorganic layer are removed in examples in which a resin corresponding to the second organic layer is hardly disposed in the peripheral area.

According to the present exemplary embodiment, it is possible to provide a display device that is capable of reducing the lifting phenomenon that occurs in the peripheral area and improving the reliability by removing the second organic layer and the second inorganic layer disposed in the peripheral area in the color conversion panel.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:
1. A display device comprising:
a thin film transistor panel comprising a display area and a peripheral area; and
a color conversion panel overlapping the thin film transistor panel,
wherein the color conversion panel includes:
a substrate;

a color conversion layer disposed between the substrate and the thin film transistor panel and comprising semiconductor nanocrystals;

a first organic layer disposed between the color conversion layer and the thin film transistor panel;

a second organic layer disposed between the first organic layer and the thin film transistor panel;

a polarization layer disposed between the second organic layer and the thin film transistor panel; and a first inorganic layer disposed between the first organic and the second organic layer, wherein the first organic layer overlaps the display area and the peripheral area, and the second organic layer overlaps the display area.

2. The display device of claim 1, wherein the second organic layer does not overlap the peripheral area in a plan view.

3. The display device of claim 1, further comprising: a second inorganic layer disposed between the second organic layer and the polarization layer.

4. The display device of claim 3, wherein the first inorganic layer overlaps the display area and the peripheral area, and the second inorganic layer overlaps the display area, and wherein an edge of the second inorganic layer is disposed between the display area and an edge of the thin film transistor panel adjacent to the edge of the second organic layer.

5. The display device of claim 4, wherein the second inorganic layer does not overlap the peripheral area in a plan view.

6. The display device of claim 3, wherein the second inorganic layer partially overlaps the peripheral area in a plan view.

7. The display device of claim 3, further comprising a dummy color filter layer overlapping the peripheral area.

8. The display device of claim 7, wherein the dummy color filter layer overlaps the first organic layer and the first inorganic layer.

9. The display device of claim 7, wherein the dummy color filter layer in a plan view does not overlap the second organic layer and the second inorganic layer in a plan view.

10. The display device of claim 3, wherein edges of the second organic layer and the second inorganic layer substantially coincides with each other.

11. The display device of claim 1, wherein the second organic layer partially overlaps the peripheral area.

12. The display device of claim 1, wherein edges of the polarization layer and the second organic layer substantially overlap each other.

* * * * *